United States Patent
Shiga

(10) Patent No.: US 10,629,460 B2
(45) Date of Patent: Apr. 21, 2020

(54) CIRCULATION COOLING AND HEATING DEVICE FOR CONTROLLING A TEMPERATURE OF A CIRCULATING FLUID SUPPLIED TO A CHAMBER

(71) Applicant: KELK LTD., Hiratsuka-shi, Kanagawa (JP)

(72) Inventor: Kazuya Shiga, Hiratsuka (JP)

(73) Assignee: KELK LTD., Hiratsuka-Shi, Kanagawa (JP)

(*) Notice: Subject to any disclaimer, the term of this patent is extended or adjusted under 35 U.S.C. 154(b) by 898 days.

(21) Appl. No.: 14/911,009

(22) PCT Filed: Jul. 29, 2014

(86) PCT No.: PCT/JP2014/069884
§ 371 (c)(1),
(2) Date: Feb. 8, 2016

(87) PCT Pub. No.: WO2015/019893
PCT Pub. Date: Feb. 12, 2015

(65) Prior Publication Data
US 2016/0196991 A1 Jul. 7, 2016

(30) Foreign Application Priority Data
Aug. 9, 2013 (JP) ................................. 2013-166864

(51) Int. Cl.
*H01L 21/67* (2006.01)
*H01J 37/32* (2006.01)

(52) U.S. Cl.
CPC .. *H01L 21/67109* (2013.01); *H01J 37/32009* (2013.01); *H01J 37/32522* (2013.01);
(Continued)

(58) Field of Classification Search
CPC ......... C30B 25/00; C30B 25/02; C30B 25/10; H01L 21/67109; H01L 21/67017; H01L 21/67069; H01J 37/32009; H01J 37/32522; H01J 37/32724; H01J 2237/334
(Continued)

(56) References Cited

U.S. PATENT DOCUMENTS 7,000,416 B2 2/2006 Hirooka et al.
2004/0129224 A1* 7/2004 Yamazaki ........... C23C 16/4401
118/724
(Continued)

FOREIGN PATENT DOCUMENTS

CN 202982940 U 6/2013
JP 10141831 A 5/1998
(Continued)

OTHER PUBLICATIONS

Chinese Office Action (and partial English translation thereof) dated Mar. 31, 2017 issued in counterpart Chinese Application No. 201480044231.0.
(Continued)

*Primary Examiner* — Kenneth A Bratland, Jr.
(74) *Attorney, Agent, or Firm* — Holtz, Holts & Volek PC

(57) ABSTRACT

A circulating cooling/heating device configured to cool and heat a circulating fluid supplied to a chamber in plasma-etching equipment includes: a heat exchanger configured to perform heat exchange between the circulating fluid and a cooling water; a heater configured to heat the circulating fluid; a pump configured to circulate the circulating fluid between the circulating cooling/heating device and the chamber; a cooling water circulation block through which the cooling water passes; and a pressure sensor serving as a pressure detecting unit configured to detect a pressure of the cooled or heated circulating fluid, the pressure sensor being attached to the cooling water circulation block.

2 Claims, 6 Drawing Sheets

(52) U.S. Cl.
CPC .. *H01L 21/67017* (2013.01); *H01L 21/67069* (2013.01); *H01J 37/32724* (2013.01); *H01J 2237/334* (2013.01)

(58) Field of Classification Search
USPC ............ 117/84–86, 200–202; 118/715, 722, 118/723 R, 724; 156/345.1, 345.24, 156/345.26, 345.27, 345.37
See application file for complete search history.

(56) References Cited

U.S. PATENT DOCUMENTS

| | | | |
|---|---|---|---|
| 2006/0191897 A1 | 8/2006 | Hozumi | |
| 2006/0201172 A1* | 9/2006 | Kaneko | F25D 17/02 62/180 |
| 2008/0041077 A1* | 2/2008 | Tutunoglu | F25D 19/00 62/186 |

FOREIGN PATENT DOCUMENTS

| | | | |
|---|---|---|---|
| JP | 11-241896 | * | 9/1999 |
| JP | 11241896 A | | 9/1999 |
| JP | 2002022300 A | | 1/2002 |
| JP | 2002168551 A | | 6/2002 |
| JP | 2002348670 A | | 12/2002 |
| JP | 2006210732 A | | 8/2006 |
| JP | 2006253454 A | | 9/2006 |
| KR | 100751726 B1 | | 8/2007 |
| KR | 1020090030071 A | | 3/2009 |
| KR | 101109731 B1 | | 2/2012 |

OTHER PUBLICATIONS

International Preliminary Report on Patentability (IPRP) including Written Opinion (in English) dated Feb. 9, 2016, issued in parent International Application No. PCT/JP2014/069884.

Japanese Office Action (and English translation thereof) dated Nov. 15, 2016, issued in counterpart Japanese Application No. 2013-166864.

Korean Office Action (and English translation thereof) dated Oct. 20, 2016, issued in counterpart Korean Application No. 10-2016-7002525.

International Search Report (ISR) dated Oct. 28, 2014 issued in International Application No. PCT/JP2014/069884.

* cited by examiner

CIRCULATION COOLING AND HEATING DEVICE FOR CONTROLLING A TEMPERATURE OF A CIRCULATING FLUID SUPPLIED TO A CHAMBER

TECHNICAL FIELD

The present invention relates to a circulating cooling/heating device and, in particular, to a circulating cooling/heating device provided to plasma-etching equipment.

BACKGROUND ART

Typical semiconductor processing equipment such as plasma-etching equipment is provided with a temperature control device for controlling the temperature of a chamber. Specifically, a pump-discharge flow rate of a temperature-adjusted circulating fluid is measured in advance using a flowmeter, and the temperature control device performs a feedback control based on the measurement result to adjust the pump-discharge flow rate to a flow rate setpoint, thereby maintaining the temperature of the chamber at a temperature setpoint. Thus, the temperature control device includes a circulating cooling/heating device configured to cool/heat the circulating fluid, which is circulated between the temperature control device and the chamber by a pump after being temperature-adjusted, and measure the flow rate of the circulating fluid.

The temperature of the circulating fluid, which is typically set at approximately 90 degrees C., has recently been demanded to be set higher. However, such a high-temperature circulating fluid may thermally affect a typical flowmeter with a revolving part such as a rotor, lowering the mechanical reliability of the flowmeter. In view of the above, a high-temperature resistant flowmeter is favorably usable. However, such a flowmeter is costly because it is structurally complicated and made of a special material to reduce a thermal influence on it.

It is widely known that the flow rate of the circulating fluid supplied to the chamber interrelates with the fluid pressure of the circulating fluid flowing in a flow path (see, for instance, Patent Literature 1). Thus, a pressure sensor, which is structurally simple and unlikely to be thermally affected, may be used instead of a flowmeter to maintain the pressure of the circulating fluid at a pressure setpoint based on the detected pressure of the circulating fluid or to adjust the flow rate of the circulating fluid to a flow rate setpoint based on a flow rate calculated from the detected pressure. This technique eliminates the necessity of a costly flowmeter, and thus reduces the component costs of the circulating cooling/heating device.

CITATION LIST

Patent Literature(s)

Patent Literature 1: JP-A-2006-210732

SUMMARY OF THE INVENTION

Problem(s) to be Solved by the Invention

However, it may be difficult to sufficiently prevent the pressure sensor, which is generally unlikely to be thermally affected, from being thermally affected when the circulating fluid with a further high temperature is used. In this case, the pressure sensor may be demanded to have a special structure to ensure the reliability of the pressure sensor, which results in an increase in the component costs of the circulating cooling/heating device not as much as a high-temperature resistant flowmeter but to a certain extent.

An object of the invention is to provide a reliable circulating cooling/heating device provided with an inexpensive pressure sensor.

Means for Solving the Problem(s)

According to an aspect of the invention, a circulating cooling/heating device configured to cool and heat a circulating fluid supplied to a chamber in plasma-etching equipment includes: a heat exchanger configured to perform heat exchange between the circulating fluid and a cooling water; a heater configured to heat the circulating fluid; a pump configured to circulate the circulating fluid between the circulating cooling/heating device and the chamber; a cooling water circulation block through which the cooling water passes; and a pressure detecting unit configured to detect a pressure of the cooled or heated circulating fluid, the pressure detecting unit being attached to the cooling water circulation block.

In the above aspect, it is preferable that the circulating cooling/heating device further includes: a pressure take-out portion through which the pressure of the circulating fluid is obtained, the pressure take-out portion being distanced from the pressure detecting unit; and a pressure take-out pipe with a predetermined length that connects the pressure detecting unit and the pressure take-out portion, in which the pressure take-out portion lies at a high level in a gravity direction and the pressure detecting unit lies at a low level in the gravity direction, the pressure take-out pipe is inclined between the pressure take-out portion and the pressure detecting unit, and an inclination angle of the pressure take-out pipe with respect to a horizontal plane is in a range from 10 degrees to 30 degrees.

In the above aspect, it is preferable that the circulating cooling/heating device further includes a cooling fan configured to allow a cooling air to flow along a predetermined direction, in which the pressure detecting unit lies upstream in a flow direction of the cooling air.

In the above aspect, the circulating cooling/heating device controls a discharge flow rate of the temperature-adjusted circulating fluid from the pump to be constant based on a detection result from the pressure detecting unit to maintain a constant temperature in the chamber. In the circulating cooling/heating device, the cooling water circulation block is kept at a low temperature by the cooling water flowing in the cooling water circulation block. Thus, the pressure detecting unit, which is attached to the cooling water circulation block, is also kept at a low temperature, and is unlikely to be thermally affected by the circulating fluid with a high temperature. Consequently, the reliability of the inexpensive pressure detecting unit can be ensured.

In the above aspect, the circulating cooling/heating device includes the inclined pressure take-out pipe through which the pressure of the circulating fluid is obtained. Thus, air in the pressure take-out pipe moves upward along the inclination of the pressure take-out pipe to be discharged out of the pressure take-out pipe, so that the pressure of the circulating fluid can be detected with a good responsiveness. In the pressure take-out pipe, the circulating fluid is present in an amount proportional to the length of the pressure take-out pipe. However, such a circulating fluid with a high temperature does not always flow but stagnates in the pressure take-out pipe. Thus, the pressure take-out pipe is unlikely to be thermally affected by the circulating fluid irrespective of whether or not the length of the pressure take-out pipe is increased.

When the inclination angle of the pressure take-out pipe is less than 10 degrees, the inclination of the pressure take-out pipe is so small that the air or the like in the pressure take-out pipe cannot be sufficiently released upward. In contrast, when the inclination angle is greater than 30 degrees, the pressure detecting unit and the pressure take-out portion may be extremely close to each other. The layout thus becomes complicated, causing a trouble in, for instance, maintenance.

In the above aspect, the circulating cooling/heating device includes the pressure detecting unit disposed upstream in the flow direction of the cooling air. Thus, the pressure detecting unit is further effectively cooled by the cooling air with a low temperature passing near the pressure detecting unit, so that the thermal influence can thus be further reduced.

BRIEF DESCRIPTION OF DRAWING(S)

DESCRIPTION OF EMBODIMENT(S)

An exemplary embodiment of the invention will be described below with reference to the attached drawings.

Figure 1:
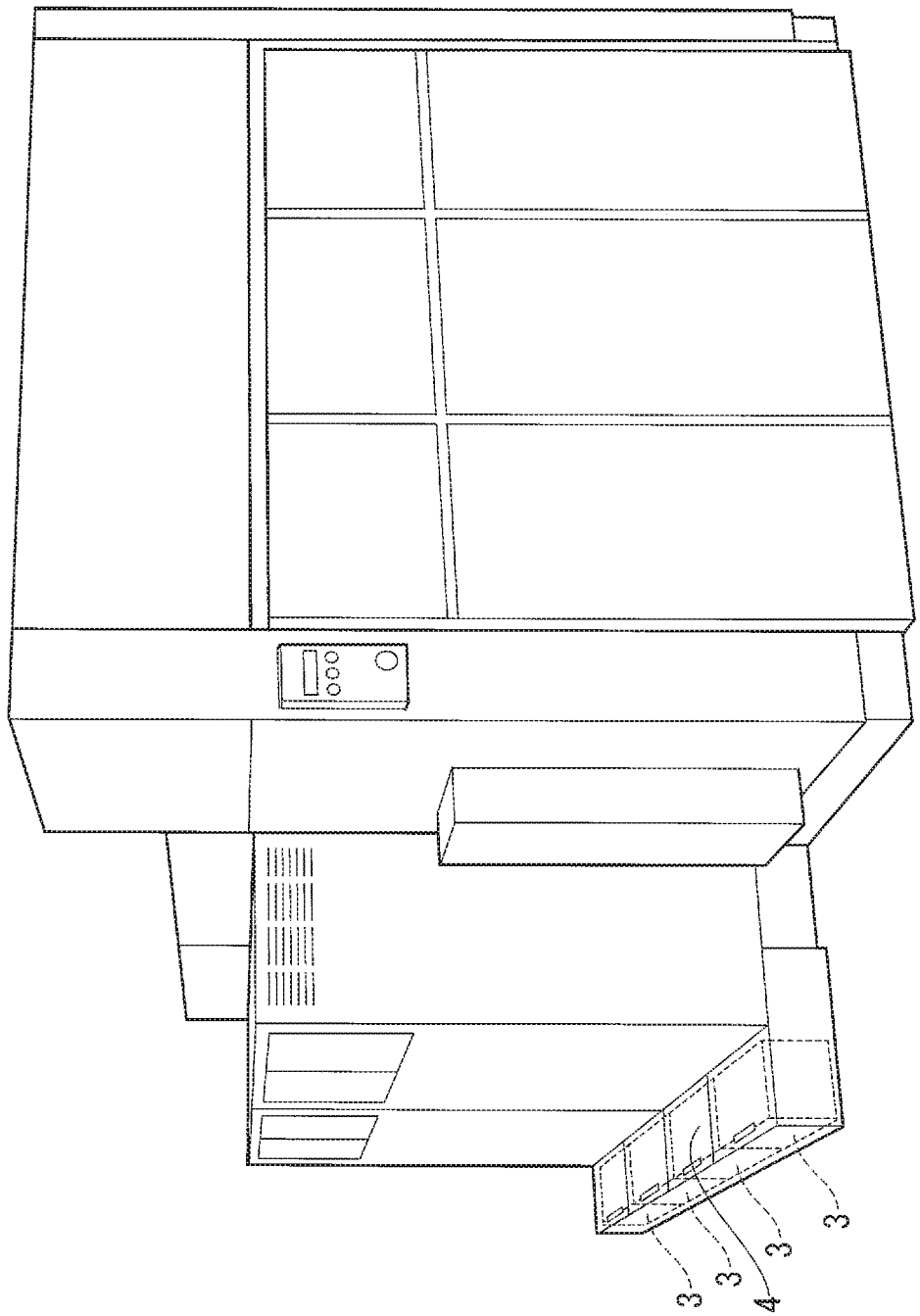
FIG. 1 is a perspective view showing plasma-etching equipment employing a circulating cooling/heating device according to an exemplary embodiment of the invention.
Figure 2:
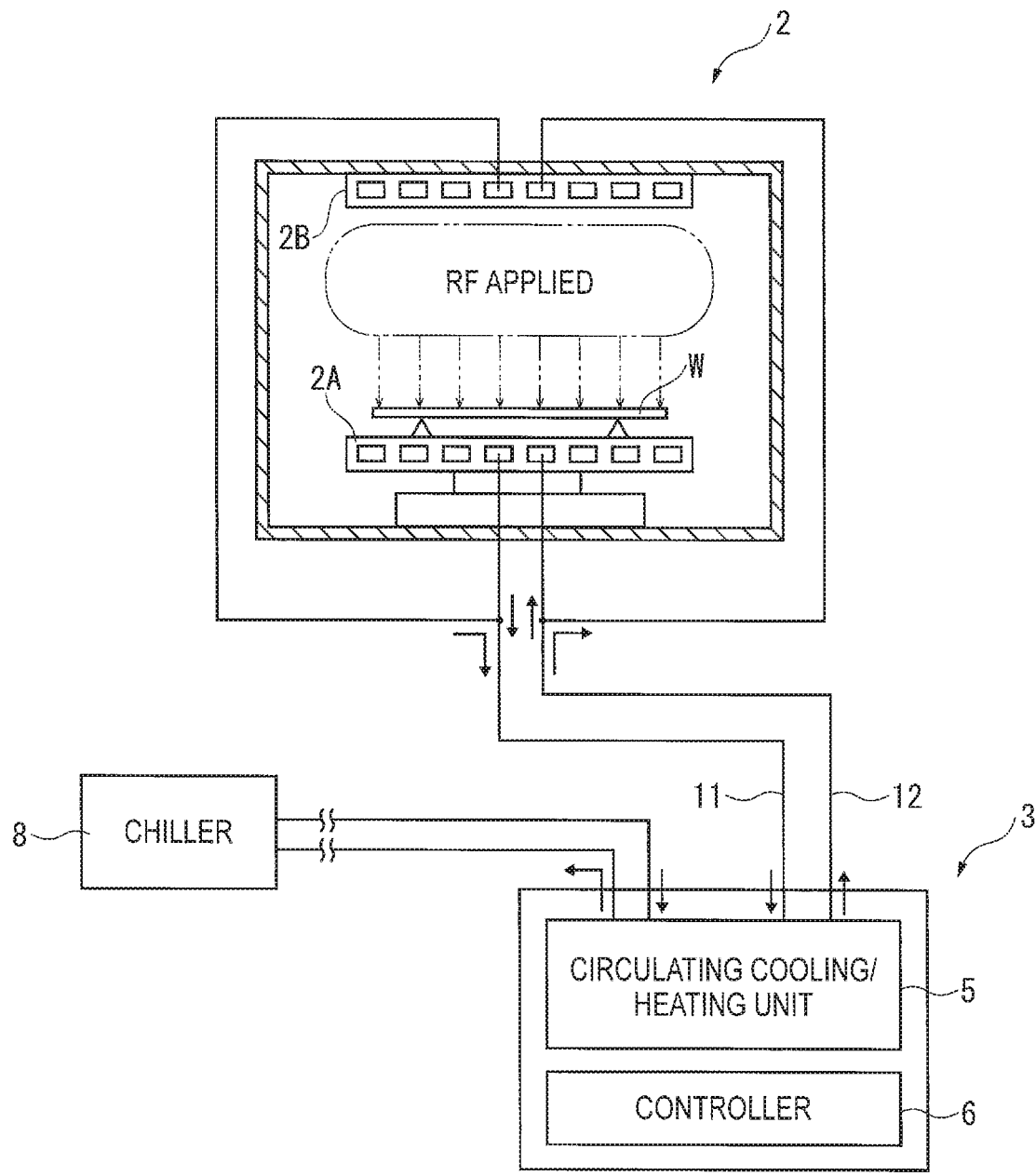
FIG. 2 is a schematic view showing a chamber and a temperature control device in the plasma-etching equipment.

FIG. 1 is a perspective view showing plasma-etching equipment 1 according to the exemplary embodiment. FIG. 2 is a schematic view showing a chamber 2 and a temperature control device 3 in the plasma-etching equipment 1.
General Description of Overall Arrangement of Plasma-Etching Equipment As shown in FIGS. 1 and 2, the plasma-etching equipment 1, which is equipment performing a plasma-dry process to etch a semiconductor wafer W, includes therein the chamber 2 including a plurality of chambers (only one of them is shown in FIG. 1). The temperature of each of the chambers 2 is adjusted to a predetermined temperature setpoint using a temperature-adjusted circulating fluid supplied from the temperature control device 3. In the exemplary embodiment, the temperature control device 3 includes a plurality of temperature control devices corresponding to the plurality of chambers 2 and is housed in a step 4 for an operator disposed on a side of the plasma-etching equipment 1.

In performing the etching process, the chambers 2 are vacuumed and maintained at a predetermined low pressure. An etching gas (a process gas) is introduced into the chambers 2 in the low-pressure state. The introduced etching gas is turned into plasma to etch the semiconductor wafer W. In performing the above process, the respective temperatures of the chambers 2 are adjusted to the temperature setpoint using the circulating fluid from the temperature control devices 3.

Figure 3:
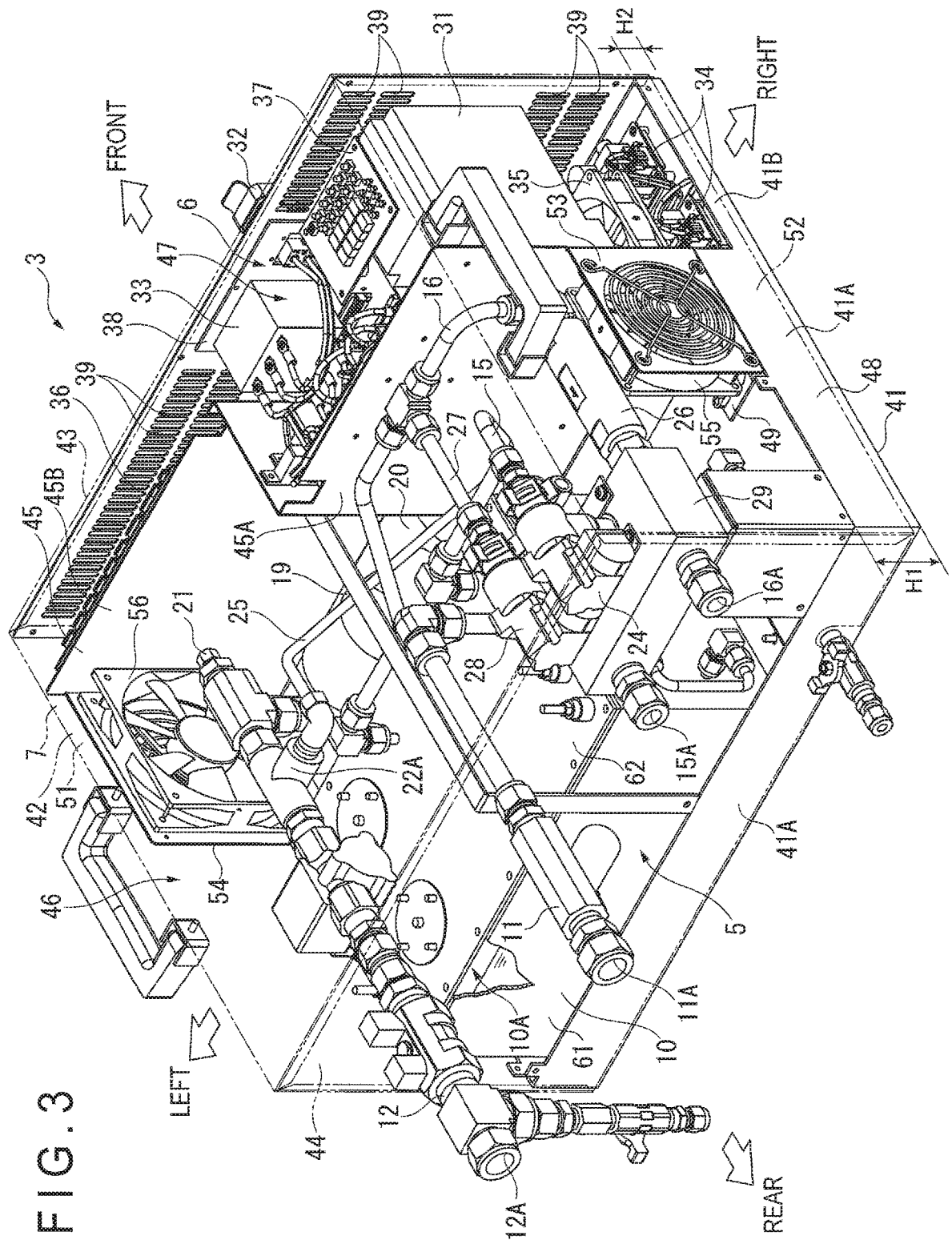
FIG. 3 is a perspective view showing an overall arrangement of the temperature control device.
Figure 4:
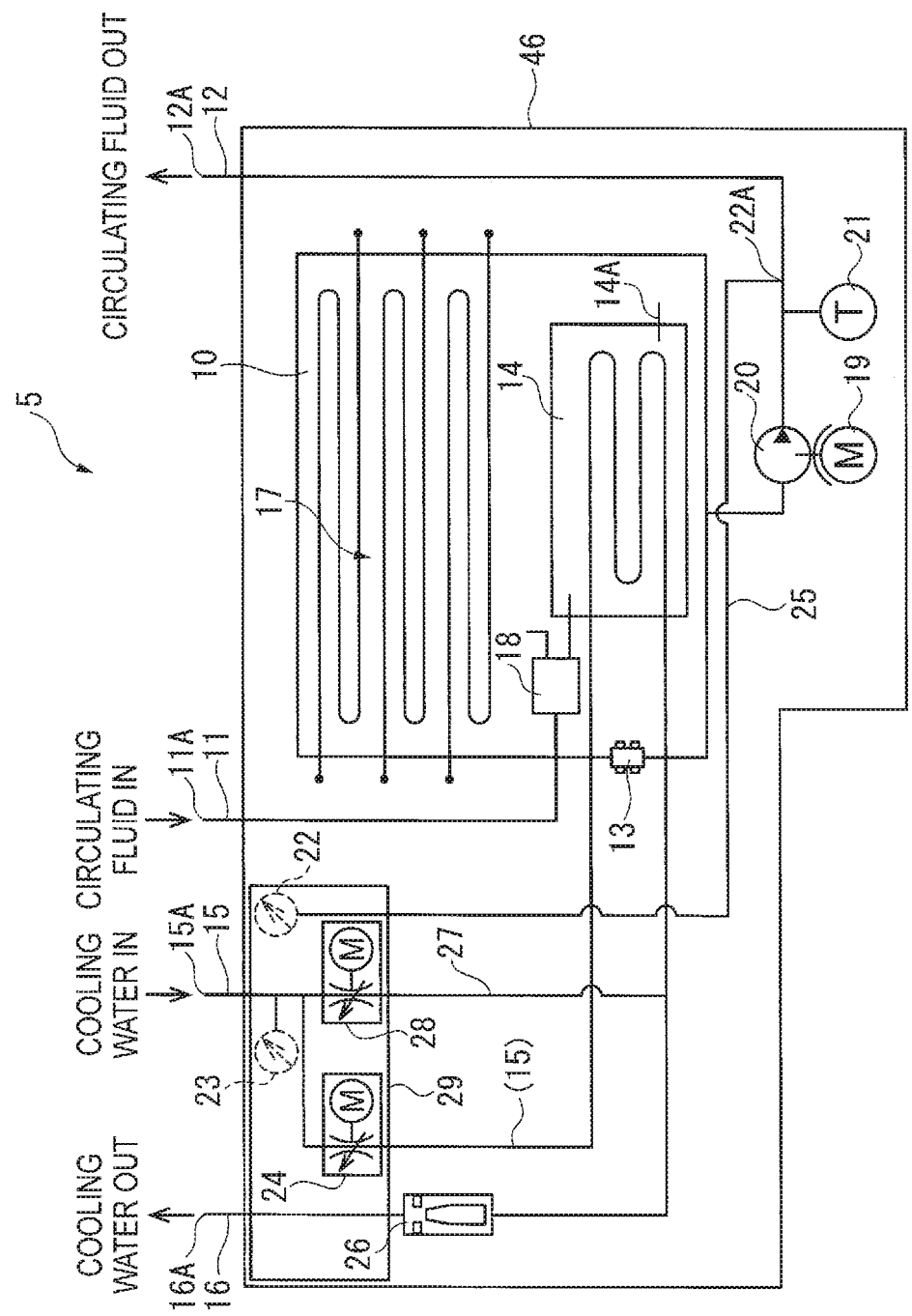
FIG. 4 shows a schematic arrangement and a fluid circuit of the circulating cooling/heating device provided to the temperature control device.
Figure 5:
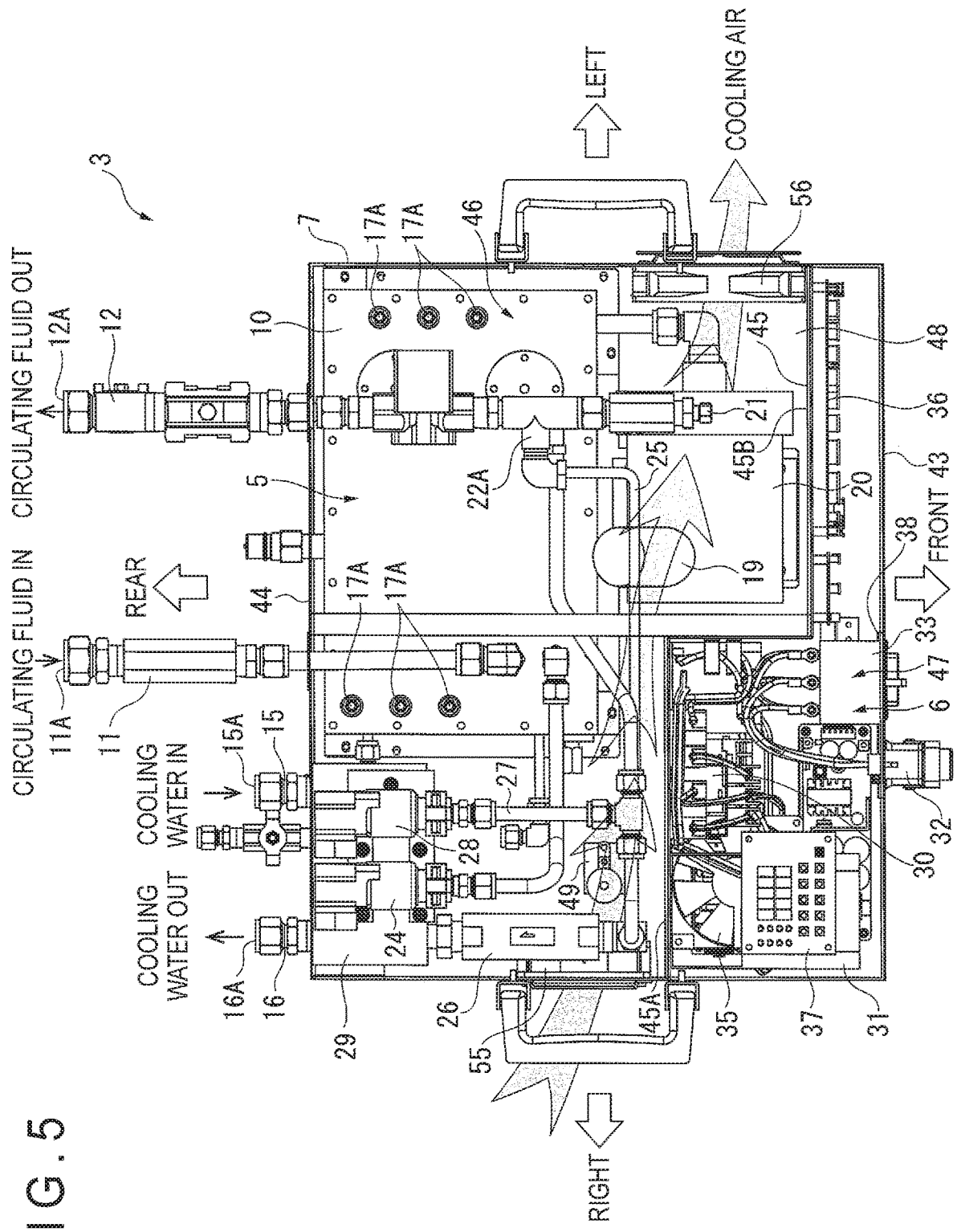
FIG. 5 is a plan view showing an interior of the temperature control device.

In the exemplary embodiment, the chambers 2 each include a lower electrode 2A on which the semiconductor wafer W is to be mounted, and an upper electrode 2B disposed above the lower electrode 2A, and the circulating fluid flows through an inner path defined in each of the electrodes 2A, 2B to adjust the temperature of each of the chambers 2. In each of the chambers 2, a capacitively coupled plasma is generated by applying an RF (Radio Frequency) electric field between the electrodes 2A, 2B. It should be noted that the chambers 2 may each be configured to generate, for instance, an electron cyclotron resonance plasma, a helicon-wave-excited plasma, an inductively coupled plasma or a microwave-excited surface-wave plasma in place of a capacitively coupled plasma.
Description of Temperature Control Device FIG. 3 is a perspective view showing an overall inner arrangement of each of the temperature control devices 3 as viewed from the rear. FIG. 4 shows a schematic arrangement and a fluid circuit of a circulating cooling/heating unit 5 provided to each of the temperature control devices 3. FIG. 5 is a plan view showing an interior of the temperature control devices 3. It should be noted that the upper side in FIG. 3 corresponds to the upper side in a gravity direction and the lower side in FIG. 3 corresponds to the lower side in the gravity direction. The front, rear, right and left directions are defined as shown by arrows in FIGS. 3 and 5.

As shown in FIGS. 3 to 5, the temperature control devices 3 each include: the circulating cooling/heating unit 5 (a circulating cooling/heating device) that cools and heats the circulating fluid circulated between each of the temperature control devices 3 and the corresponding chamber 2; a controller 6 that controls the temperature of the circulating fluid based on, for instance, a detection signal outputted from a later-described pressure sensor 22 (a pressure detecting unit) provided to the circulating cooling/heating unit 5 to adjust the temperature of the corresponding chamber 2 to a temperature setpoint; and a housing 7 for housing the circulating cooling/heating unit 5 and the controller 6.

In each of the temperature control devices 3, the circulating cooling/heating unit 5 and the controller 6, which will be described later in detail, are arranged in a front-and-rear positional relationship on the same level. Therefore, in the case of maintenance on the circulating cooling/heating unit 5 and the controller 6 of one of the temperature control devices 3, a large part of the circulating cooling/heating unit 5 and the controller 6 can be exposed by removing a part of the housing 7 of the one of the temperature control devices 3, so that the maintenance can be easily performed from above. Further, the maintenance can be performed without pulling the one of the temperature control devices 3 out of a housing portion defined in the step 4 to a wider area, so that it is not necessary to provide a large installation space in consideration of the necessity of such a wider area.

It should be noted that the circulating cooling/heating unit 5 of each of the temperature control devices 3 in the exemplary embodiment is connected to a chiller 8. The chiller 8 supplies and circulates a cooling water with a constant temperature to the circulating cooling/heating unit 5. The cooling water is used to cool the circulating fluid in the circulating cooling/heating unit 5. The circulating fluid is a fluorine coolant such as GALDEN (a trademark of Ausimont K.K.) and Fluorinert (a trademark of 3M Company).

Description of Circulating Cooling/Heating Unit

The circulating cooling/heating unit 5 occupies a rear area defined in each of the temperature control devices 3. When the circulating cooling/heating unit 5 is disposed in the rear area, a pipe for the circulating fluid and a pipe for the cooling water extending rearward from the circulating cooling/heating unit 5 can be arranged under a body of the plasma-etching equipment 1 and connected to the chamber 2 or the chiller 8. The pipes are thus not exposed outside the plasma-etching equipment 1, so that it is not necessary to prepare a space for pipe arrangement in addition to the installation space for the plasma-etching equipment 1.

Further, since the circulating cooling/heating unit 5 is close to the chamber 2 and the like, the pipes may be shortened to reduce the usage of the circulating fluid. As a result, a reservoir 10 storing the circulating fluid and a heat exchanger 14 (both described later) can be reduced in capacity or size, thereby considerably downsizing the circulating cooling/heating unit 5 and, consequently, each of the temperature control devices 3. Each of the temperature control devices 3 can thus be reliably housed in a narrow installation space defined in the step 4.

Specifically, the circulating cooling/heating unit 5 includes the reservoir 10 storing the circulating fluid. The reservoir 10 is connected to an inflow path 11 and an outflow path 12, which respectively include an inflow portion 11A and an outflow portion 12A for the circulating fluid. The reservoir 10 has therein a clearance space above the circulating fluid stored in the reservoir 10. The clearance space, which is unfilled with the circulating fluid, defines an air chamber 10A as shown in a partially cutaway view of the reservoir 10 in FIG. 3.

Volume contraction or volume expansion of the circulating fluid resulting from cooling or heating the circulating fluid is acceptable due to a change in the capacity of the air chamber 10A. A breather 13 is provided on a side of the reservoir 10 to prevent an excessive pressure change resulting from a change in the capacity of the air chamber 10A. The breather 13 admits or releases air into or out of the air chamber 10A in accordance with the pressure of the air chamber 10A to maintain the pressure of the air chamber 10A within a predetermined range.

In the reservoir 10, the heat exchanger 14 is housed and constantly immersed in the circulating fluid. The inflow path 11 for the circulating fluid has an end connected to the heat exchanger 14 in the reservoir 10. The heat exchanger 14 has an outlet 14A for discharging the circulating fluid into the reservoir 10. The heat exchanger 14 performs thermal exchange between the circulating fluid and the cooling water to cool the circulating fluid. The heat exchanger 14 is thus connected to an inflow path 15 and an outflow path 16, which respectively include an inflow portion 15A and an outflow portion 16A for the cooling water. The inflow path 15 and the outflow path 16 define a continuous cooling-water flow path, a middle part of which with a necessary length is disposed in the heat exchanger 14.

Since the heat exchanger 14 is immersed in the circulating fluid, the circulating fluid entering the heat exchanger 14 is also cooled from an outside of the heat exchanger 14 by the cooled circulating fluid. Further, since the heat exchanger 14 is housed in the reservoir 10, it is not necessary to provide an installation space for the heat exchanger 14 outside the reservoir 10 even though the size of the reservoir 10 has to be slightly increased. The circulating cooling/heating unit 5 can thus be reliably downsized as a whole even though the size of the reservoir 10 itself is slightly increased.

In the reservoir 10, a heater 17 including three sheathed heaters is also housed. Terminals 17A of the sheathed heaters are exposed on an upside of the reservoir 10, and the sheathed heaters generate heat with an electric power supplied through the terminals 17A. The circulating fluid is heated by the heat generated by the sheathed heaters.

In the reservoir 10, the inflow path 11 for the circulating fluid is provided with a relief valve 18. When the flow of the circulating fluid into the heat exchanger 14 is restricted for any reason and the pressure of the circulating fluid in the heat exchanger 14 exceeds a predetermined level, the relief valve 18 is opened to release the circulating fluid into the reservoir 10.

The outflow path 12 for the circulating fluid is provided with a pump 20, which is configured to be driven by a motor 19, disposed at an outside of the reservoir 10 and between the controller 6 and the reservoir 10 arranged at front and rear sides. The outflow path 12 is also provided with a temperature sensor 21 disposed downstream of the pump 20, and a pressure take-out portion 22A, through which a pressure to be detected by the pressure sensor 22 is obtained, disposed further downstream of the pump 20. When the pump 20 is driven, the circulating fluid is circulated between the circulating cooling/heating unit 5 and the corresponding chamber 2. It should be noted that the outflow path 12 has a base end opened in the reservoir 10 at an appropriate position determined depending on, for instance, actual installation positions of the heat exchanger 14 and the heater 17.

Similarly, at the outside of the reservoir 10, the inflow path 15 for the cooling water is provided with a pressure sensor 23 disposed near the inflow portion 15A and a proportional valve 24 disposed downstream of the pressure sensor 23. The outflow path 16 is provided with a constant flow valve 26. An upstream side of the inflow path 15 relative to the proportional valve 24 and an upstream side of the outflow path 16 relative to the constant flow valve 26 are in communication with each other through a bypass 27. The bypass 27 is provided with a proportional valve 28. The opening degree of a diaphragm mechanism of each of the proportional valves 24, 28 can be changed to adjust the flow rate of the cooling water flowing through the heat exchanger 14, thereby adjusting the cooling performance of the heat exchanger 14. The cooling water is circulated using a pump (not shown) in the chiller 8 (FIG. 2).

Figure 6:
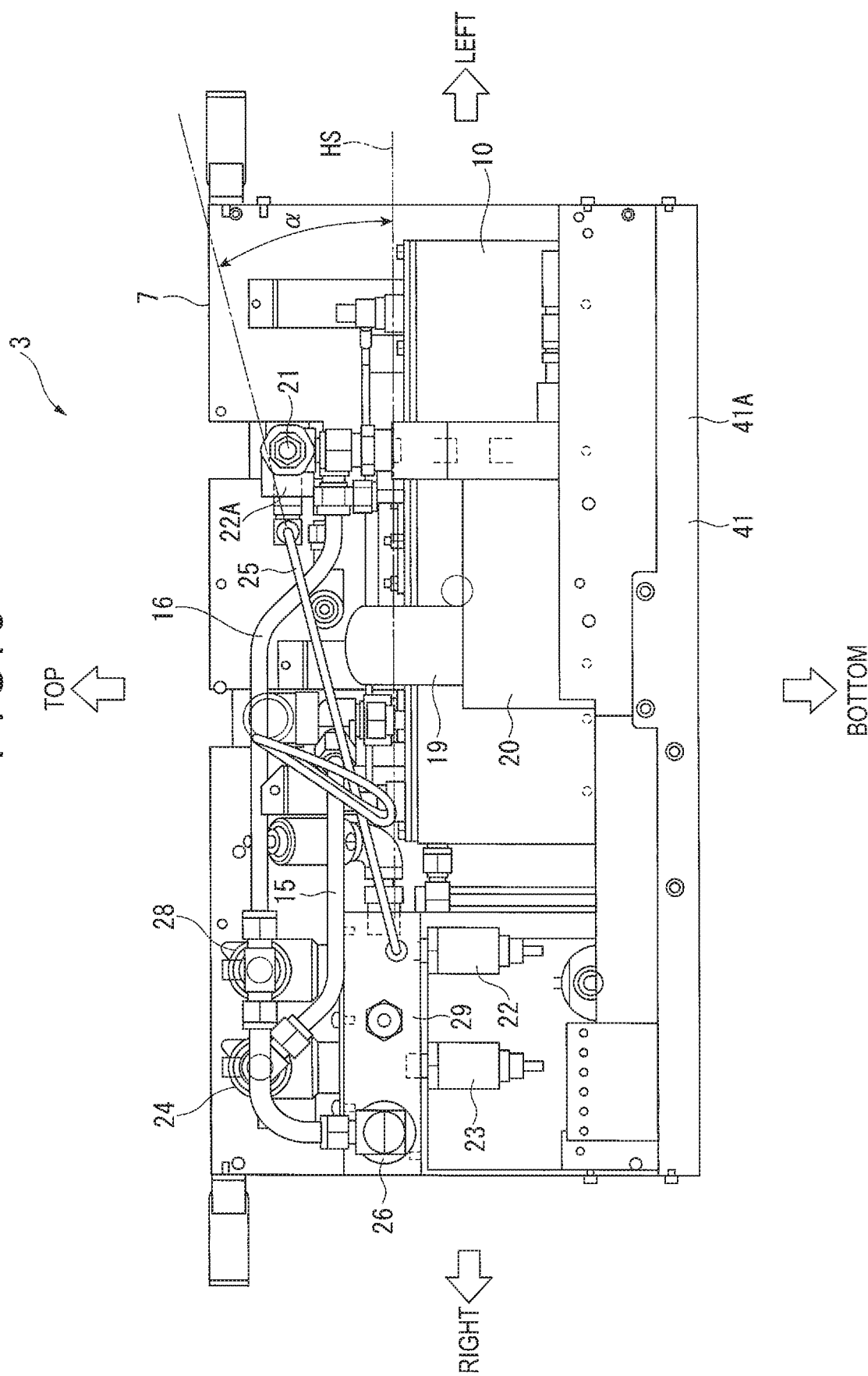
FIG. 6 is a front view showing the circulating cooling/heating device, in which front-side members are partly removed.

A part of the inflow path 15 near an upstream end thereof, a part of the outflow path 16 near a downstream end thereof, and a part of the bypass 27 are disposed in a cooling water circulation block 29 made of metal such as brass. In other words, the cooling water circulation block 29 is provided to define the bypass 27 from the inflow path 15 toward the outflow path 16. The cooling water passing through the cooling water circulation block 29 keeps the temperature of the cooling water circulation block 29 considerably low as compared with the temperatures of the inflow path 11 and the outflow path 12. As also shown in FIG. 6, the proportional valves 24, 28 are attached at an upper side of the cooling water circulation block 29. Further, the pressure sensor 22 for detecting the pressure of the circulating fluid and the pressure sensor 23 for detecting the pressure of the cooling water are disposed side by side at a lower side of the cooling water circulation block 29.

Description of Controller

The controller 6 controls, for instance, the drive of the pump 20, the opening degree of each of the proportional valves 24, 28, and ON/OFF of the heater 17 based on the temperature detected by the temperature sensor 21, the pressure detected by the pressure sensor 22 and other various parameters. The controller 6 occupies a front area in the temperature control device 3 as shown in FIG. 3.

The controller 6 includes: an solid state relay (SSR) 30 (FIG. 5) functioning as a switch for switching ON/OFF of the heater 17; and an inverter 31 provided with a driving circuit for the pump 20. The controller 6 further includes, for instance, a power connector 32, connectors for connecting various interface cables, a power switch box 33, a power source board 34, a cooling fan 35 for cooling the inverter 31, a central processing unit (CPU) board 36, and a control panel 37.

Typically, a heater is provided in each electrode of a chamber, and ON/OFF of the heater is controlled by a temperature control device. This is because, for instance, in view of the fact that heat is absorbed from the circulating fluid in the middle of a long pipe extending from a circulating cooling/heating device, the circulating fluid typically has to be further heated using the heater in each electrode. However, with the above arrangement, the temperature of the circulating fluid can be adjusted up to approximately 90 degrees C. at the highest. Further, the typical temperature control device requires a costly filter for reducing noise generated by the heater in each electrode.

In contrast, in the exemplary embodiment, the pipe for circulation is shortened and the usage of the circulating fluid is reduced, so that even the heater 17 with a relatively small size is sufficient to adjust the temperature of the circulating fluid up to approximately 150 degrees C., as described above. Thus, it is not necessary to provide a heater in each of the electrodes 2A, 2B of each of the chambers 2, so that the production cost of temperature control device 3 can be reliably reduced.

Description of Housing

As shown in FIG. 3, the housing 7 includes: a bottom panel 41 on which the circulating cooling/heating unit 5 and the controller 6 are mounted; an upper cover 42 (shown by two-dot chain lines in FIG. 3) covering an upper side and lateral sides of each of the circulating cooling/heating unit 5 and the controller 6; a front cover 43 fixed to the bottom panel 41 and the upper cover 42 to cover a front of the temperature control device 3; a rear cover 44 (shown by two-dot chain lines in FIG. 3) similarly fixed to the bottom panel 41 and the upper cover 42 to cover a rear of the temperature control device 3; and a partitioning panel 45 dividing a space in the temperature control device 3 into front and rear parts. A space behind the partitioning panel 45 is defined as a circulation chamber 46 where the circulating cooling/heating unit 5 is disposed, whereas a space in front of the partitioning panel 45 is defined as a control chamber 47 where the controller 6 is provided. In other words, the chambers 46, 47 are present on the same level.

The bottom panel 41 includes a rise portion 41A formed along a periphery of the bottom panel 41 corresponding to the circulation chamber 46. A height H1 of the rise portion 41A is higher than a height H2 of a rise portion 41B formed along a periphery corresponding to the control chamber 47. Specifically, the bottom panel 41 defines a pan 48 surrounded by the rise portion 41A along a bottom-side periphery thereof corresponding to the circulation chamber 46. A bottom of the pan 48 is provided with a fluid-leakage sensor 49 that detects the circulating fluid.

The circulating fluid and the cooling water flow into and out of the circulation chamber 46. In the case where the circulating fluid and the cooling water leak in the circulation chamber 46, the leakage can be received by the pan 48. As a result, the circulating fluid and the cooling water can be prevented from leaking into the control chamber 47 to affect an electronic component or the like or from leaking outside. Further, when the leakage of the circulating fluid and the cooling water onto the pan 48 is detected by the fluid-leakage sensor 49, the leakage is displayed on the control panel 37, a display provided to the plasma-etching equipment 1, or the like.

The upper cover 42 has an upper surface 51 and right and left side surfaces 52, 52, and can be upwardly removed using right and left handles after being unfixed from the bottom panel 41, the front cover 43 and the rear cover 44. The control panel 37 is attached to the upper surface 51 of the upper cover 42 at a position corresponding to the control chamber 47.

The front cover 43 is attached with the power connector 32, a signal transmission/reception connector, the power switch box 33 and the like via a plate 38. The front cover 43 is provided with a large number of slits 39 . . . for releasing heat generated by electric or electronic components of the controller 6. The slits 39 are also provided to the side surfaces 52 of the upper cover 42 and the rear cover 44.

The rear cover 44 is provided with a plurality of openings for avoiding interference with the inflow portion 11A and the outflow portion 12A for the circulating fluid and the inflow portion 15A and the outflow portion 16A for the cooling water.

The partitioning panel 45, which includes a first planar portion 45A and a second planar portion 45B, is in a shape of a crank in a plan view. The SSR 30, the inverter 31, the power switch box 33, the power source board 34, the cooling fan 35, the control panel 37 and the like are disposed in a wider installation space defined in the control chamber 47 by the first planar portion 45A. In contrast, in a narrower installation space defined in the control chamber 47 by the second planar portion 45B, a CPU board 36 and the like are disposed.

In the circulation chamber 46, a narrower installation space is defined behind the wider installation space of the control chamber 47 by the first planar portion 45A, and the proportional valves 24, 28, the constant flow valve 26, the pressure sensor 23 for the cooling water, the cooling water circulation block 29, and the like are disposed in this narrower installation space. In contrast, in the circulation chamber 46, a wider installation space is defined behind the narrower installation space of the control chamber 47 by the second planar portion 45B, and the reservoir 10, the pump 20, the temperature sensor 21, and the like are disposed in the wider installation space.

Right and left sides of the partitioning panel 45 are respectively integral with rectangular attachment pieces 53, 54 bent relative to the first and second planar portions 45A, 45B. A suction fan 55 (a cooling fan), which is attached to the attachment piece 53, is disposed in the narrower installation space of the circulation chamber 46. An exhaust fan 56 (a cooling fan), which is attached to the attachment piece 54, is disposed in the wider installation space of the circulation chamber 46. The side surfaces 52 of the upper cover 42 are provided with openings through which cooling air flows in and out at positions corresponding to the fans 55, 56.

Description of Flow of Cooling Air in Circulation Chamber

FIG. 5 is a plan view showing an interior of the temperature control device 3. In FIG. 5, a flow of the cooling air through the circulation chamber 46 is shown by inserted arrows.

As shown in FIG. 5, the cooling air sucked from the outside of the temperature control device 3 through the suction fan 55 provided at the right side of the temperature control device 3 first flows left along a rear surface of the first planar portion 45A of the partitioning panel 45. Heat-generating components such as the SSR 30 and the inverter 31 are attached on a front surface of the first planar portion 45A, and thus the rear surface of the first planar portion 45A functions as a heat-radiating surface that radiates generated heat. Therefore, when the cooling air flows along the rear surface, heat radiated through the first planar portion 45A can be immediately released outside the housing 7 so as not to stay in the circulation chamber 46.

The cooling air then enters the wider installation space of the circulation chamber 46, and flows between the second planar portion 45B and the reservoir 10. The motor 19 and the pump 20 driven by the motor 19 are thus cooled by the cooling air. The cooling air is then discharged outside the temperature control device 3 through the exhaust fan 56 provided at the left side of the temperature control device 3.

Further, the cooling water circulation block 29, which is attached with the pressure sensor 22 (FIG. 6) and the like, is disposed upstream in a flow direction of the cooling air, so that the ambient air of the cooling water circulation block 29 is discharged through the exhaust fan 56 along with the flow of the cooling air. The pressure sensor 22 and the like are thus exposed in a low-temperature area. The pressure sensor 23 and other components such as the proportional valves 24, 28 and the constant flow valve 26 are also exposed in the low-temperature area.

Layout of Pressure Sensor and Pressure Take-Out Pipe

FIG. 6 is a front view showing the circulating cooling/heating unit 5, in which members of the controller 6 and the partitioning panel 45 disposed at the front side are partly removed. In FIG. 6, the top, bottom, right and left directions are indicated by arrows as in other figures.

As shown in FIGS. 3 to 6, the pressure sensor 22 for detecting the pressure of the circulating fluid is attached to the lower side of the cooling water circulation block 29 as described above. The cooling water flowing through the cooling water circulation block 29 has a considerably low temperature as compared with the circulating fluid, so that the temperature of the cooling water circulation block 29 is lowered. Further, the pressure sensor 22 attached to the cooling water circulation block 29 is also maintained at a low temperature. The pressure sensor 22 is thus unlikely to be thermally affected by the circulating fluid with a high temperature. Consequently, the reliability of the inexpensive pressure sensor 22 can be ensured while costs are reduced.

Further, the pressure sensor 22, which is attached to the lower side of the cooling water circulation block 29, lies at a low level relative to the pressure take-out portion 22A disposed above the reservoir 10. Further, the pressure take-out portion 22A, which is disposed above the reservoir 10, and the pressure sensor 22, which is disposed at the lower side of the cooling water circulation block 29, are considerably distanced from each other in a right-left direction.

The pressure take-out portion 22A and the pressure sensor 22 are connected to each other through the pressure take-out pipe 25. The pressure take-out pipe 25, a base end of which is connected to the pressure take-out portion 22A, is first bent horizontally forward to a slight extent. Subsequently, the pressure take-out pipe 25 is bent right and inclined downward, and then horizontally bent toward the cooling water circulation block 29 disposed further downstream. A distal end of the pressure take-out pipe 25 is connected to the cooling water circulation block 29, so that the pressure of the circulating fluid is applied to the pressure sensor 22 through the interior of the cooling water circulation block 29. The pressure take-out pipe 25 is a pipe for taking out the pressure of the circulating fluid, so that the circulating fluid does not always flow through the pressure take-out pipe 25. Thus, the diameter of the pressure take-out pipe 25 is smaller than those of pipes defining the inflow path 11 and the outflow path 12.

As shown in FIG. 6, the pressure take-out pipe 25 is inclined with respect to a horizontal plane HS at an inclination angle in a range from 10 degrees to 30 degrees. In the exemplary embodiment, the pressure take-out pipe 25 is inclined at an inclination angle $\alpha$ of approximately 15 degrees. Air or the like entering the pressure take-out pipe 25 flows upward along the inclination of the pressure take-out pipe 25 to be discharged into the outflow path 12 through the pressure take-out portion 22A. When the inclination angle $\alpha$ of the pressure take-out pipe 25 is less than 10 degrees, the inclination of the pressure take-out pipe is so small that the air or the like in the pressure take-out pipe cannot be sufficiently released upward. In contrast, when the inclination angle $\alpha$ is greater than 30 degrees, the pressure sensor 22 and the pressure take-out portion 22A are extremely close to each other, and need to occupy an installation space for other pipes and/or components. As a result, the layout becomes complicated due to a dense arrangement of the components, causing a trouble, for instance, in maintenance.

Incidentally, it should be understood that the scope of the invention is not limited to the above-described exemplary embodiment(s) but includes modifications and improvements compatible with the invention.

For instance, in the exemplary embodiment, the inflow path 15 and outflow path 16 for the cooling water both partly lie in the cooling water circulation block 29, but only either one thereof may lie in the cooling water circulation block 29 according to the invention as long as the cooling water passes through the cooling water circulation block to maintain the cooling water circulation block at a low temperature.

In the exemplary embodiment, the cooling water circulation block 29 is provided to define the bypass 27 from the inflow path 15 to the outflow path 16, but may be provided for any other purpose according to the invention. For instance, the cooling water circulation block 29 may be provided as a mount for the pressure detecting unit.

In the exemplary embodiment, the pressure take-out pipe 25 is inclined, but may not be inclined according to the invention. In this case, for instance, the pressure sensor 22 may be disposed at the upper side of the cooling water circulation block 29. In other words, the invention merely requires the pressure detecting unit such as the pressure sensor to be attached to the cooling water circulation block.

In the exemplary embodiment, the cooling fan according to the invention includes both of the suction fan 55 and the exhaust fan 56, but may include only either one thereof.

The invention claimed is:

1. A circulating cooling/heating device configured to cool and heat a circulating fluid supplied to a chamber in plasma-etching equipment, the circulating cooling/heating device comprising:
   a heat exchanger configured to perform heat exchange between the circulating fluid and a cooling water;
   a heater configured to heat the circulating fluid;
   a pump configured to circulate the circulating fluid between the circulating cooling/heating device and the chamber;
   a cooling water circulation block through which the cooling water passes;

a pressure detecting unit configured to detect a pressure of the cooled or heated circulating fluid, the pressure detecting unit being attached to the cooling water circulation block;

a pressure take-out portion through which the pressure of the circulating fluid is obtained, the pressure take-out portion being distanced from the pressure detecting unit; and a pressure take-out pipe with a predetermined length that connects the pressure detecting unit and the pressure take-out portion, wherein:

the pressure take-out portion lies at a higher level in a gravity direction than the pressure detecting unit, the pressure take-out pipe is inclined between the pressure take-out portion and the pressure detecting unit, and an inclination angle of the pressure take-out pipe with respect to a horizontal plane is in a range from 10 degrees to 30 degrees.

2. The circulating cooling/heating device according to claim 1, further comprising a cooling fan configured to allow a cooling air to flow along a predetermined direction, wherein the pressure detecting unit lies upstream with respect to the pump in a flow direction of the cooling air.

* * * * *